(12) United States Patent
Takahashi

(10) Patent No.: US 10,569,665 B2
(45) Date of Patent: Feb. 25, 2020

(54) SUSPENDED UNDERFLOOR POWER CONVERTER

(71) Applicant: Fuji Electric Co., Ltd., Kanagawa (JP)

(72) Inventor: Kiyoshi Takahashi, Kanagawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/028,905

(22) Filed: Jul. 6, 2018

(65) Prior Publication Data

US 2019/0047423 A1 Feb. 14, 2019

(30) Foreign Application Priority Data

Aug. 14, 2017 (JP) .................................. 2017-156592

(51) Int. Cl.

| | |
|---|---|
| *B60L 53/20* | (2019.01) |
| *B60L 53/22* | (2019.01) |
| *B60L 5/18* | (2006.01) |
| *B60M 1/12* | (2006.01) |
| *H05K 5/00* | (2006.01) |
| *H05K 5/02* | (2006.01) |
| *H05K 7/18* | (2006.01) |
| *B61C 3/00* | (2006.01) |

(52) U.S. Cl.
CPC ................. *B60L 53/22* (2019.02); *B60L 5/18* (2013.01); *B60M 1/12* (2013.01); *H05K 5/0021* (2013.01); *H05K 5/0204* (2013.01); *H05K 7/18* (2013.01); *B60L 2200/26* (2013.01); *B61C 3/00* (2013.01); *H05K 5/0213* (2013.01)

(58) Field of Classification Search
CPC .......... B60L 5/18; B60M 1/12; H05K 5/0021; H05K 5/0204; H05K 7/18
See application file for complete search history.

(56) References Cited

U.S. PATENT DOCUMENTS

| | | | |
|---|---|---|---|
| 2011/0122669 A1* | 5/2011 | Santos .................. | H02M 7/003 363/141 |
| 2013/0016481 A1* | 1/2013 | Takahashi ............ | H05K 7/1432 361/724 |

(Continued)

FOREIGN PATENT DOCUMENTS

JP 2009-96460 A 5/2009

Primary Examiner — Binh B Tran
Assistant Examiner — Douglas R Burtner
(74) Attorney, Agent, or Firm — Chen Yoshimura LLP

(57) ABSTRACT

A power converter to be mounted to a mounting portion of a host in a suspended manner includes a plurality of component-housing chassis configured to be connected together parallel to the mounting portion, the plurality of component-housing chassis each containing parts for a power converter so that the plurality of component-housing chassis collectively constitute the power converter for the host, wherein at least one of the plurality of component-housing chassis has a support frame, the support frame protruding out so as to extend into at least an adjacent one of the component-housing chassis, wherein the at least adjacent one of the component-housing chassis has an insertion hole for inserting the support frame, and wherein the support frame is configured to be inserted into the insertion hole in the adjacent component-housing chassis and fixed to the adjacent component-housing chassis.

6 Claims, 12 Drawing Sheets

(56) References Cited

U.S. PATENT DOCUMENTS

2013/0199406 A1* 8/2013 Kanda .................. B61C 3/02
  105/35
2014/0072387 A1* 3/2014 Strizki ............... F16B 33/004
  411/371.1
2016/0362054 A1* 12/2016 Kerscher .............. B60R 9/04
2017/0166038 A1* 6/2017 Jang .................. B21D 22/022
2017/0354050 A1* 12/2017 Pedoeem ............ H05K 7/1487

* cited by examiner

SUSPENDED UNDERFLOOR POWER CONVERTER

BACKGROUND OF THE INVENTION

Technical Field

The present invention relates to a power converter to be installed in a railway vehicle, for example.

Background Art

One example of a previously proposed power converter to be mounted on the underfloor of a railway vehicle is the railway vehicle underfloor device disclosed in Patent Document 1.

This railway vehicle underfloor device includes a power converter having a chassis assembled by riveting together a bottom wall unit, sidewall units, a top wall unit, and partition wall units. Here, electrical components and wiring are fixed to a bottom wall, sidewalls, partition walls, and a top wall in advance to create respective sub-units, and then these sub-units are riveted to the bottom wall unit, which includes the bottom wall and serves as a platform. Using two of the partition wall units, the interior of the chassis is divided into three compartments in the lengthwise direction. Filter capacitors are respectively arranged near the left and right ends of the chassis, and two control units are arranged in the center. Moreover, inverter units are arranged respectively facing the two filter capacitors.

RELATED ART DOCUMENTS

Patent Documents

Patent Document 1: Japanese Patent Application Laid-Open Publication No. 2009-96460

SUMMARY OF THE INVENTION

In the conventional technology disclosed in Patent Document 1, the bottom wall sub-unit, sidewall sub-units, partition wall sub-units, and top wall sub-unit are prepared by fixing electrical components and wiring thereto, and then the chassis is assembled by riveting these sub-units to the bottom wall unit, which includes the bottom wall and serves as a platform. As the length of this chassis increases in the lengthwise direction, the mechanical strength of the bottom wall, sidewalls, and top wall must be increased in order to maintain the overall mechanical strength. This can be problematic because increasing wall thickness results in an increase in weight and an inability to satisfy weight reduction requirements.

In particular, when the chassis is divided in the lengthwise direction into a plurality of component-housing chassis which are then connected together to form a connected chassis, it is difficult to maintain mechanical strength between the connected component-housing chassis, which results in a need to install a large number of hanging lugs as holding fixtures. Moreover, it is difficult to make it easy to connect together the component-housing chassis.

The present invention was therefore made in view of the problems in the conventional technology described above and aims to provide a power converter which, when assembling a connected chassis by connecting together a plurality of component-housing chassis, makes it possible to simplify the assembly work while also reducing weight.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure a power converter to be mounted to a mounting portion of a host in a suspended manner, including: a plurality of component-housing chassis configured to be connected together parallel to the mounting portion, the plurality of component-housing chassis each containing parts for a power converter so that the plurality of component-housing chassis collectively constitute the power converter for the host, wherein at least one of the plurality of component-housing chassis has a support frame, the support frame protruding out so as to extend into at least an adjacent one of the component-housing chassis, wherein the at least adjacent one of the component-housing chassis has an insertion hole for inserting the support frame, and wherein the support frame is configured to be inserted into the insertion hole in the adjacent component-housing chassis and fixed to the adjacent component-housing chassis.

According to one aspect of the present invention, the support frame to be connected to the component-housing chassis adjacent to the base component-housing chassis is formed so as to protrude, thereby maintaining mechanical strength in the lengthwise direction of the connected chassis and making it possible to simplify the assembly work and reduce weight.

It is to be understood that both the foregoing general description and the following detailed description are exemplary and explanatory, and are intended to provide further explanation of the invention as claimed.

DETAILED DESCRIPTION OF EMBODIMENTS

Embodiments of a power converter according to the present invention will be described with reference to figures. Note that the figures are only schematic illustrations and may be different from the actual components. Moreover, the embodiments described below are only examples of a device or method for implementing the technical concepts of the present invention and do not limit the configurations of the invention to the configurations presented below. In other words, the technical concepts of the present invention allow for various modifications to be made within the technical scope defined by the claims.

First, one embodiment of a power converter according to the present invention will be described.

Figure 1:
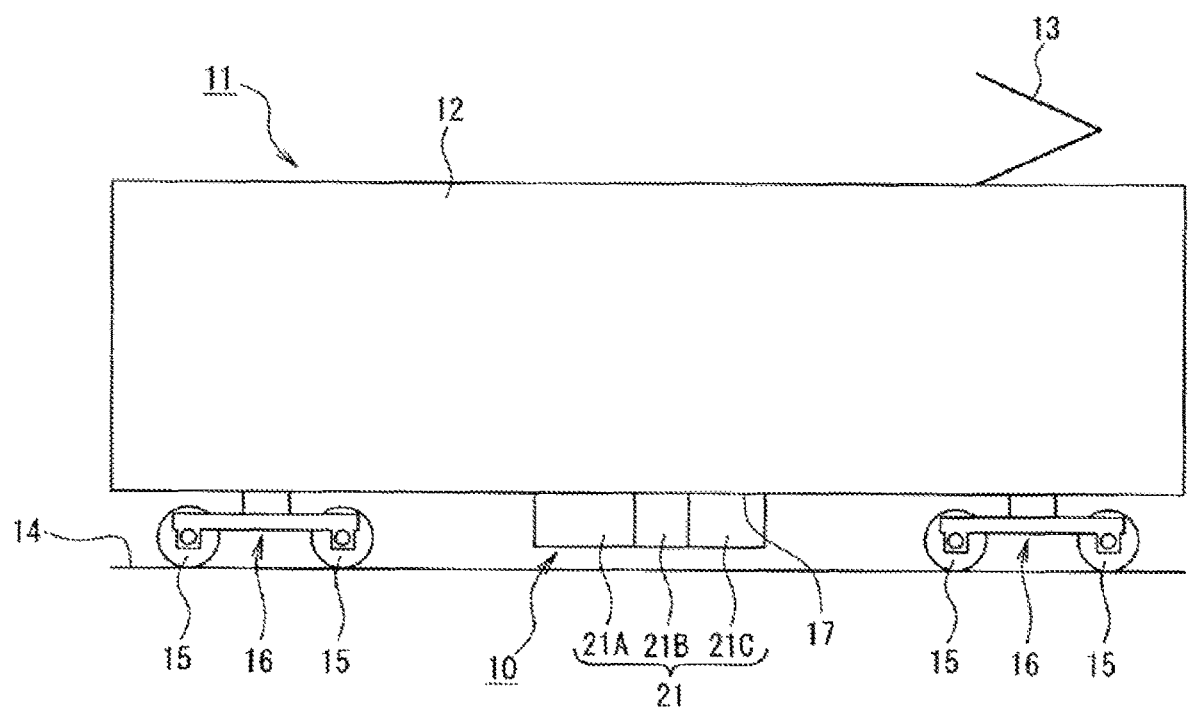
FIG. 1 is a side view illustrating a railway vehicle equipped with a power converter according to the present invention.

As illustrated in FIG. 1, in a railway vehicle 11 equipped with a power converter 10 according to the present invention, a pantograph 13 is installed on top of a vehicle body 12. Carts 16 which support wheels 15 respectively rotatably-contacting rails 14 on both lateral sides of the vehicle relative to the direction of travel are mounted on the underfloor of the vehicle body 12.

A connected chassis 21 of the power converter 10 is mounted in a suspended manner to a mounting portion 17 between the carts 16 on the underfloor of the vehicle body 12. This power converter 10 supplies electric power for use within the railway vehicle 11.

Figure 2:
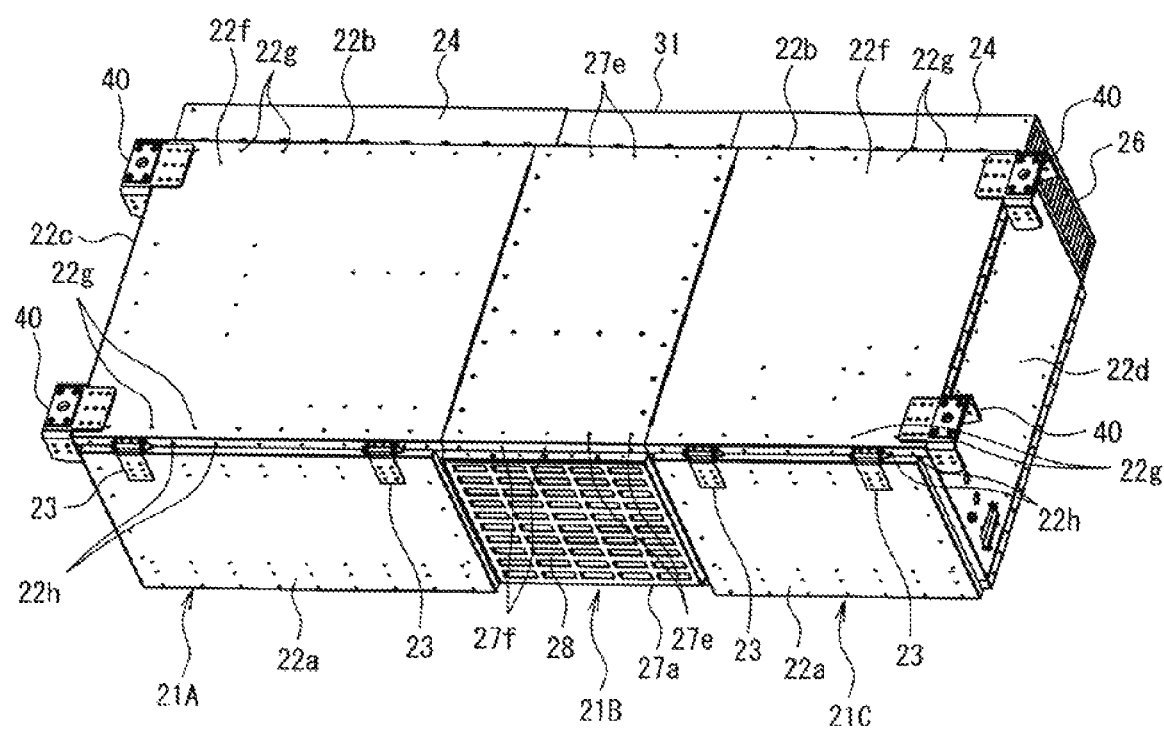
FIG. 2 is a perspective view illustrating a connected chassis of the power converter according to the present invention.

As illustrated in FIG. 2, the connected chassis 21 includes a first component-housing chassis 21A, a second component-housing chassis 21B, and a third component-housing chassis 21C, which are connected together in the movement direction of the vehicle. Here, assuming that the railway vehicle 11 is an AC electric train, the first component-housing chassis 21A houses a converter which converts single-phase AC supplied from the pantograph 13 via a transformer to DC, for example. The second component-housing chassis 21B houses components such as the transformer and a reactor, and an intake fan which draws in outside air as a cooling medium, and the like. The third component-housing chassis 21C houses an inverter which converts the DC output from the converter to three-phase alternating current.

Figure 3:
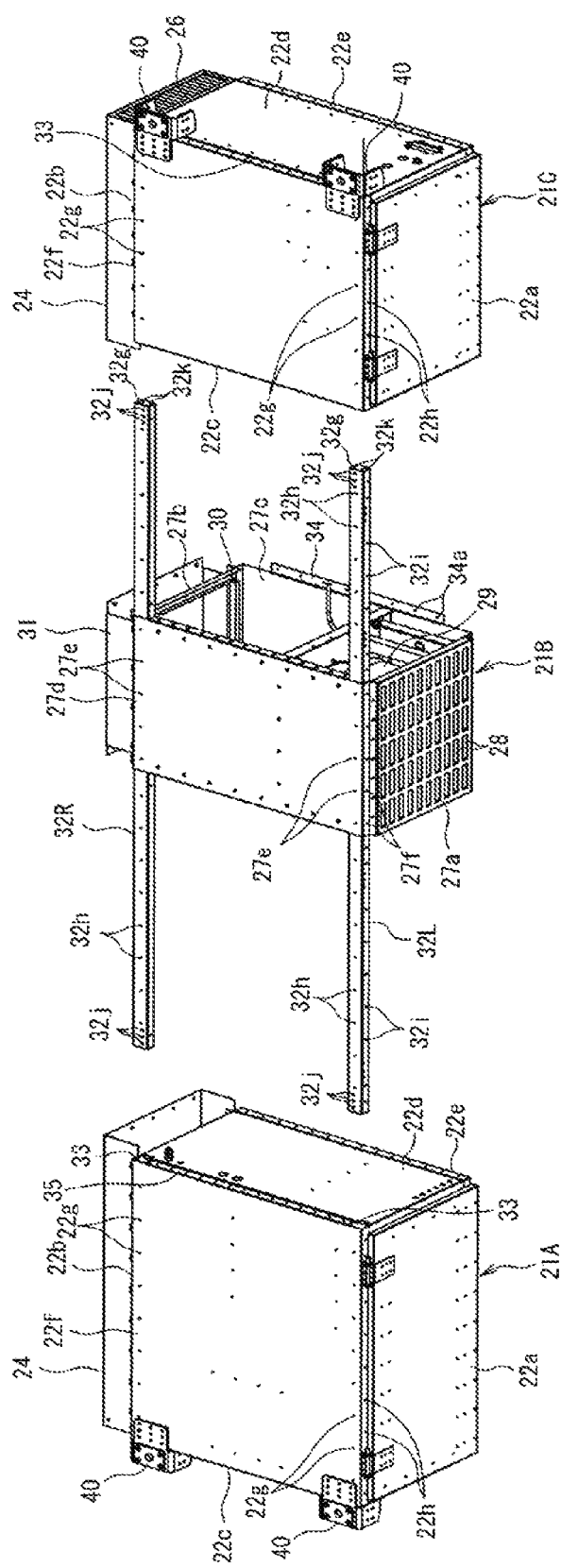
FIG. 3 is an exploded perspective view of the configuration illustrated in FIG. 2.

As illustrated in FIG. 3, the first component-housing chassis 21A and the third component-housing chassis 21C are formed as rectangular prisms respectively including a front plate 22a, a rear plate 22b, a left side plate 22c, a right side plate 22d, a bottom plate 22e, and a top plate 22f. Here, the front plate 22a serves as an opening/closing door which has the top edge thereof fixed by hinges 23 (shown in FIG. 2). The rear plate 22b has a vent (not illustrated in the figure) formed therein, and an air duct 24 is arranged on the outer side of this vent. As illustrated in FIG. 6C, in the first component-housing chassis 21A, an exhaust vent 25 in which a large number of slits are formed is formed in the left end of the air duct 24. As illustrated in FIG. 6D, in the third component-housing enclosure 21C, an exhaust vent 26 in which a large number of slits are formed is formed in the right end of the air duct 24.

As illustrated in FIG. 3, the second component-housing chassis 21B does not include a left side plate or a right side plate, and a front plate 27a, a rear plate 27b, a bottom plate 27c, and a top plate 27d are used to form a rectangular prism shape in which the left side face and right side face are open. An air intake 28 in which a large number of slits are formed is formed in the front plate 27a. An intake fan 29 is arranged on the inside facing the air intake 28. Moreover, a large vent 30 is formed in the rear plate 27b, and an air duct 31 is arranged covering this vent 30. The left and right ends of the air duct 31 are respectively connected to the air ducts 24 of the first component-housing chassis 21A and the third component-housing chassis 21C.

The second component-housing chassis 21B is designated to serve as a base component-housing chassis. In the second component-housing chassis 21B, support frames 32L and 32R are respectively attached in the corners where the back surface of the top plate 27d meets the front plate 27a and the rear plate 27b.

As illustrated larger in FIG. 4, the support frames 32L and 32R are formed to have a lipped channel (C-channel)-shaped cross-sectional shape. In other words, the support frames 32L and 32R respectively include an elongated center plate portion 32a, a front plate portion 32b, a rear plate portion 32c, and lip portions 32d and 32e bent inwards from the front plate portion 32b and the rear plate portion 32c so as to be parallel to the center plate portion 32a.

Figure 4A:
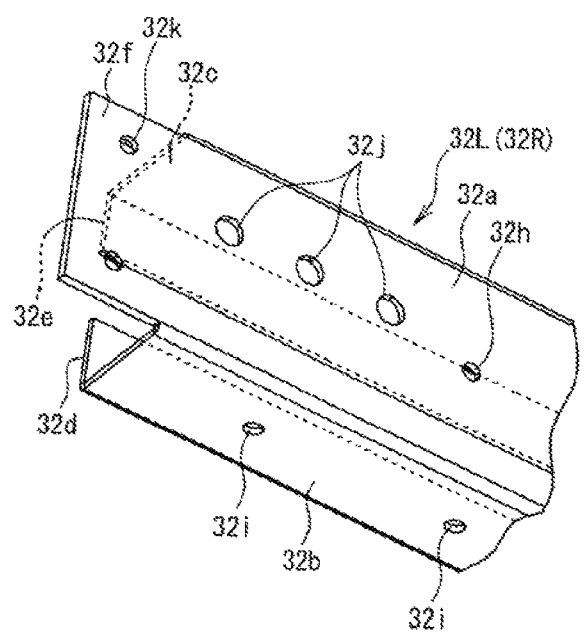
FIG. 4A is a perspective view illustrating a support frame in a state prior to finishing an end portion and FIG. 4B is a perspective view illustrating the support frame in a state after finishing the end portion.
Figure 4B:
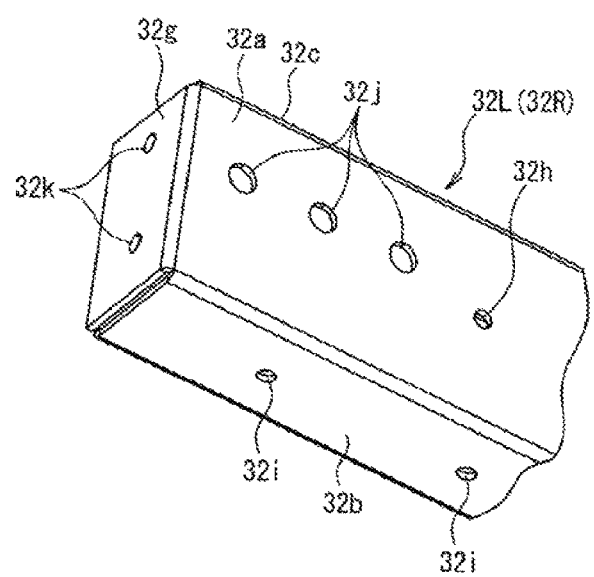

Moreover, as illustrated in FIG. 4A, on both ends of the support frames 32L and 32R in the lengthwise direction, sections, of the front plate portion 32b and the rear plate portion 32c, which has a length equal to the height of the front plate portion 32b and the rear plate portion 32c are cut away to form projecting plate portions 32f. As illustrated in FIG. 4B, these projecting plate portions 32f are bent at right angles toward the lip portions 32d and 32e to form cover plate portions 32g which cover the left and right ends of the support frames 32L and 32R.

In the center plate portion 32a, rivet holes 32h are formed for fastening to the top plates 22f of the first component-housing chassis 21A and the third component-housing chassis 21C and to the top plate 27d of the second component-housing chassis 21B. Similarly, rivet holes 32i are formed in the front plate portion 32b of the support frame 32L and in the rear plate portion 32c of the support frame 32R for fastening to the front plate 22a of the first component-housing chassis 21A, the rear plate 22b of the third component-housing chassis 21C, and the front plate 27a and rear plate 27b of the second component-housing chassis 21B. Furthermore, rivet holes 32j which serve as fasteners that fasten holding fixtures 40 (described later) are formed in the left and right ends of each center plate portion 32a, and rivet holes 32k which serve as fasteners that fasten bent portions 35 of the top plates 22f (described later) are formed in the cover plate portions 32g.

Figure 11:
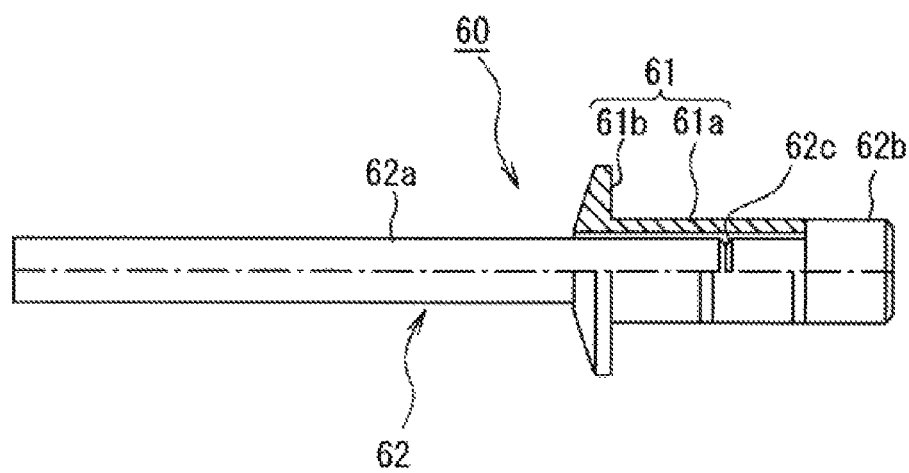
FIG. 11 is an enlarged side view illustrating a cross-section of a blind rivet.

The support frames 32L and 32R are riveted to joining positions of the top plate 27d, the front plate 27a, and the rear plate 27b of the second component-housing chassis 21B. Blind rivets 60 are used as the rivets for riveting the support frames 32L and 32R in place. As illustrated in FIG. 11, each blind rivet 60 includes a hollow rivet body 61 and a mandrel 62 which is inserted through this rivet body 61 (both of which are made of metal). The rivet body 61 includes a cylinder portion 61a and a flange 61b formed on one end of the cylinder portion 61a.

The mandrel 62 includes a shaft 62a which goes through the rivet body 61 and extends outwards from the flange 61b, and a head portion 62b formed on the side of the shaft 62a opposite to the flange 61b of the cylinder portion 61a of the rivet body 61. The head portion 62b is formed to have a greater diameter than the inner diameter of the cylinder portion 61a. A small-diameter breaking portion 62c is formed in the shaft 62a of the mandrel 62 at an intermediate position within the cylinder portion 61a of the rivet body 61 in the axial direction.

The support frames 32L and 32R and the second component-housing chassis 21B are riveted together as follows. First, the components are positioned such that the rivet holes 32h and 32i in the support frames 32L and 32R align with rivet holes 27e and 27f in the top plate 27d and the front plate 27a and rear plate 27b. Then, the mandrels 62 are inserted, with its head portion 62b side first, into the aligned rivet holes 32h and 27e (or 32i and 27f) from the outer sides thereof.

Here, the flange 61b of each rivet body 61 contacts the insertion side of a plate member (the top plate 27d, front plate 27a, or rear plate 27b), which causes the head portion 62b of each mandrel 62 to protrude out from the other side of the rivet hole. In this state, the end of the shaft 62a of the mandrel 62 protruding out from the flange 61b of the rivet body 61 is pulled out using a fastening tool (not illustrated in the figures). As a result, the head portion 62b of the mandrel 62 causes buckling deformation in the cylinder portion 61a on the side opposite to the flange 61b of the rivet body 61, thereby forming an expanded portion which protrudes outwards. When formation of this expanded portion is complete, the mandrel 62 is broken off at the small-diameter breaking portion 62c formed in the shaft 62a, thereby completing the rivet joint.

As illustrated in FIG. 3, once the second component-housing chassis 21B and the support frames 32L and 32R are fixed together in this manner, the support frames 32L and 32R protrude out from the left side face and the right side face of the second component-housing chassis 21B. Here, the protrusion length of the support frames 32L and 32R protruding from the left side face is set to the distance from the outer surface of the right side plate 22d to the back surface of the left side plate 22c of the first component-housing chassis 21A. Similarly, the protrusion length of the support frames 32L and 32R protruding from the right side face is set to the distance from the outer surface of the left side plate 22c to the back surface of the right side plate 22d of the third component-housing chassis 21C.

Moreover, the height of the support frames 32L and 32R is set to be substantially equal to the height of the bent portions 35 of the top plates 22f (described later), and the width is set to approximately half the width of a first portion 41 of each holding fixture 40 (described later).

Furthermore, as illustrated in FIG. 3, connection flanges 34 are formed protruding out from both right and left end faces of the bottom plate 27c of the second component-housing chassis 21B. In these connection flanges 34, rivet holes 34a are formed at a prescribed interval in the width direction.

Figure 5:
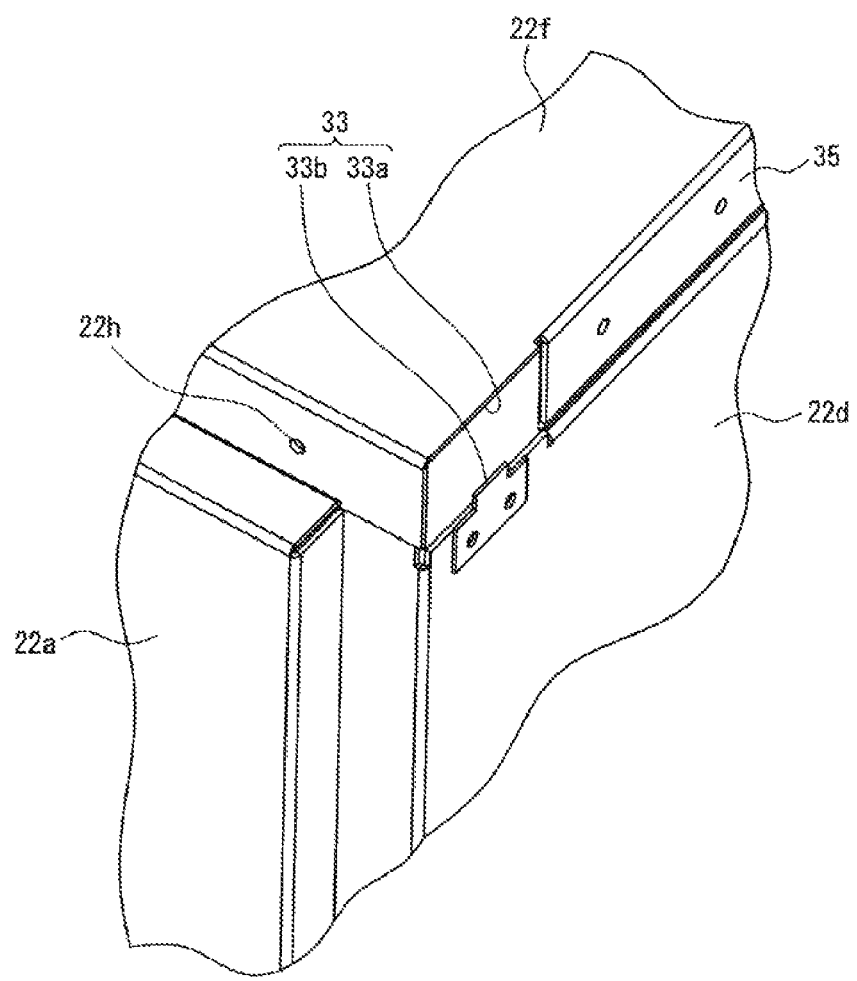
FIG. 5 is a perspective view illustrating a frame insertion hole in a first component-housing chassis.

Frame insertion holes 33 for inserting the support frames 32L and 32R are formed in the top plate 22f-side front and rear corners of the right side plate 22d of the first component-housing chassis 21A. As illustrated in FIG. 5, the frame insertion holes 33 each include an opening 33a into which the support frames 32L and 32R can be inserted as well as a protrusion 33b which is formed protruding upwards in the center of the bottom edge of the opening 33a. Moreover, the protrusions 33b are arranged so as to fit into openings not covered by the cover plate portions 32g between the lip portions 32d and 32e of the support frames 32L and 32R.

Similarly, frame insertion holes similar to the frame insertion holes 33 for inserting the support frames 32L and 32R are also formed in the top plate 22f-side front and rear corners of the left side plate 22c of the third component-housing chassis 21C.

Figure 12:
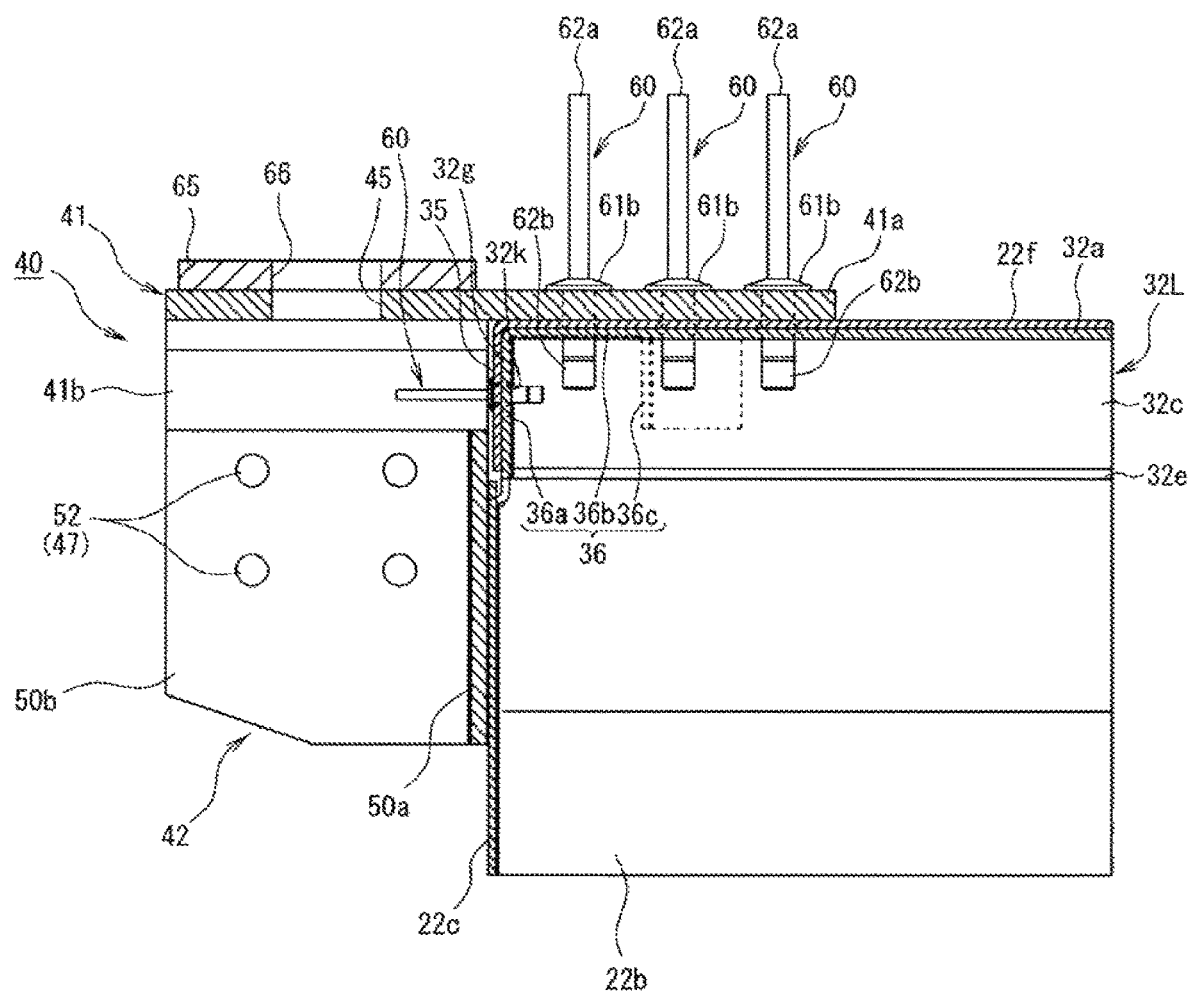
FIG. 12 is an enlarged cross-sectional view illustrating how the holding fixture gets mounted.

Here, as illustrated in FIG. 12, a bent portion 35 is formed by bending the left edge side of the top plate 22f of the first component-housing chassis 21A downwards. Meanwhile, as illustrated by the dashed line in FIG. 12, a reinforcing frame 36 which extends in the width direction (the front-rear direction) is formed on the inner side of the left side plate 22c at positions that do not face the ends of the support frames 32L and 32R.

This reinforcing frame 36 has an inverted U-shaped cross-section formed of a first plate portion 36a, a first bent plate portion 36b, and a second bent plate portion 36c. The first plate portion 36a forms a stepped portion which accommodates the bent portion 35 in the top plate 22f side of the left side plate 22c. The first bent plate portion 36b is bent rightwards from the top edge of the first plate portion 36a and runs along the back surface of the top plate 22f. The second bent plate portion 36c is bent downwards from the right edge of the first bent plate portion 36b. Although not shown, a similar reinforcing frame is also formed on the right side plate 22d of the first component-housing chassis 21A.

Similarly, in the third component-housing chassis 21C, bent portions 35 are formed in the top plate 22f, and reinforcing frames (not shown) with an inverted U-shaped cross-section similar to the reinforcing frames 36 in the first component-housing chassis 21A are formed on the left side plate 22c and the right side plate 22d.

Moreover, although this is not illustrated in the figures, rivet holes are formed in the bottom plates 22e of the first component-housing chassis 21A and the third component-housing chassis 21C at positions facing the rivet holes 34a in the connection flanges 34 in the second component-housing chassis 21B.

Next, as illustrated in FIG. 3, in a state where the support frames 32L and 32R protruding from the second component-housing chassis 21B face the frame insertion holes 33 in the first component-housing chassis 21A, the support frames 32L and 32R are inserted in the frame insertion holes 33. As illustrated in FIG. 12, when the left end face of the second component-housing chassis 21B contacts the right side plate 22d of the first component-housing chassis 21A, the cover plate portions 32g of the support frames 32L and 32R contact the back surface (inner surface) of the bent portion 35 of the top plate 22f which is bent towards the left side plate 22c. In this state, the support frame 32L, the top plate 22f, and the front plate 22a are fixed together using the blind rivets 60, and the support frame 32R, the top plate 22f, and the rear plate 22b are fixed together using the blind rivets 60.

Moreover, when the left end of the second component-housing chassis 21B contacts the right end of the first component-housing chassis 21A, the connection flange 34 of the second component-housing chassis 21B contacts the bottom surface of the bottom plate 22e of the first component-housing chassis 21A, and the rivet holes 34a formed in the connection flange 34 align with the rivet holes formed in the bottom plate 22e. In this state, the connection flange 34 and the bottom plate 22e of the first component-housing chassis 21A are fastened together using the blind rivets 60.

Similarly, in a state where the support frames 32L and 32R of the second component-housing chassis 21B face the frame insertion holes in the third component-housing chassis 21C, the support frames 32L and 32R are inserted into those frame insertion holes. When the right end of the second component-housing chassis 21B contacts the left end of the third component-housing chassis 21C, the cover plate portions 32g of the support frames 32L and 32R contact the back surface (inner surface) of the bent portion 35 in the top plate 22f of the third component-housing chassis 21C.

In this state, the support frames 32L and 32R and the top plate 22f, the front plate 22a, the rear plate 22b, and the bent portion 35 in the top plate 22f of the third component-housing chassis 21C are riveted together as described above using the blind rivets 60. Furthermore, the rivet holes 34a in the connection flange 34 protruding from the bottom plate 27c of the second component-housing chassis 21B and the rivet holes formed in the bottom plate 22e of the third component-housing chassis 21C are riveted together using the blind rivets 60.

In this way, the first component-housing chassis 21A, the second component-housing chassis 21B, and the third component-housing chassis 21C are connected together to form the connected chassis 21. As described above, in this connected chassis 21, the support frames 32L and 32R fixed to the second component-housing chassis 21B are inserted into and riveted to the first component-housing chassis 21A and the third component-housing chassis 21C. This makes it possible to achieve sufficient mechanical strength against the bending loads applied by the weight of the connected chassis 21 itself about both lengthwise ends thereof (that is, about the left end of the first component-housing chassis 21A and the right end of the third component-housing chassis 21C), for example.

Moreover, as described above, the second component-housing chassis 21B is also riveted to the first component-housing chassis 21A and the third component-housing chassis 21C at the connection flanges 34 on the bottom surface side, thereby making it possible to further improve mechanical strength. In other words, this makes it possible to prevent the bottom portions between the second component-housing chassis 21B and the first component-housing chassis 21A and third component-housing chassis 21C from spreading when a bending load is applied to the second component-housing chassis 21B from above.

Furthermore, holding fixtures 40 which serve as hanging lugs for supporting the connected chassis in a suspended manner from the underfloor of the vehicle body 12 of the railway vehicle 11 are respectively fixed at positions near the ends in the width direction (the front-rear direction) of the left edge side of the top plate 22f of the first component-housing chassis 21A and at positions near the ends in the width direction (the front-rear direction) of the right edge side of the top plate 22f of the third component-housing chassis 21C.

Figure 9:
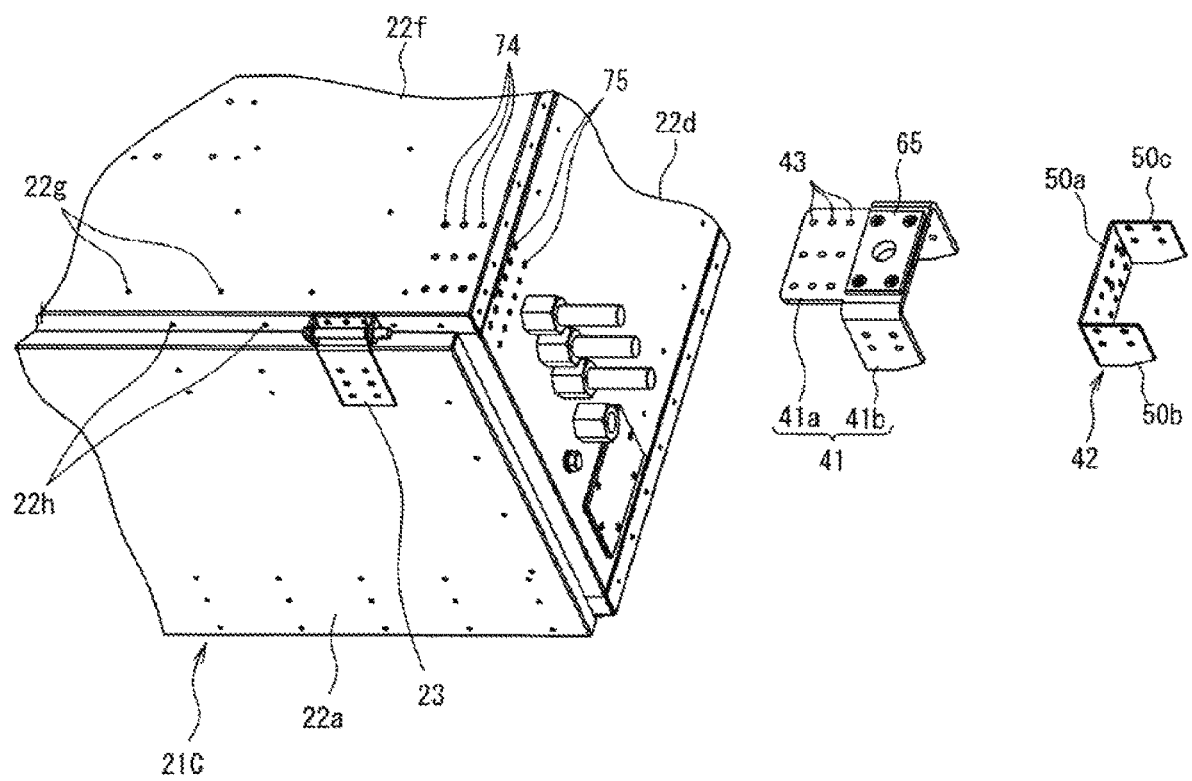
FIG. 9 is an enlarged perspective view of a state in which a holding fixture of a third component-housing chassis has been removed.
Figure 10:
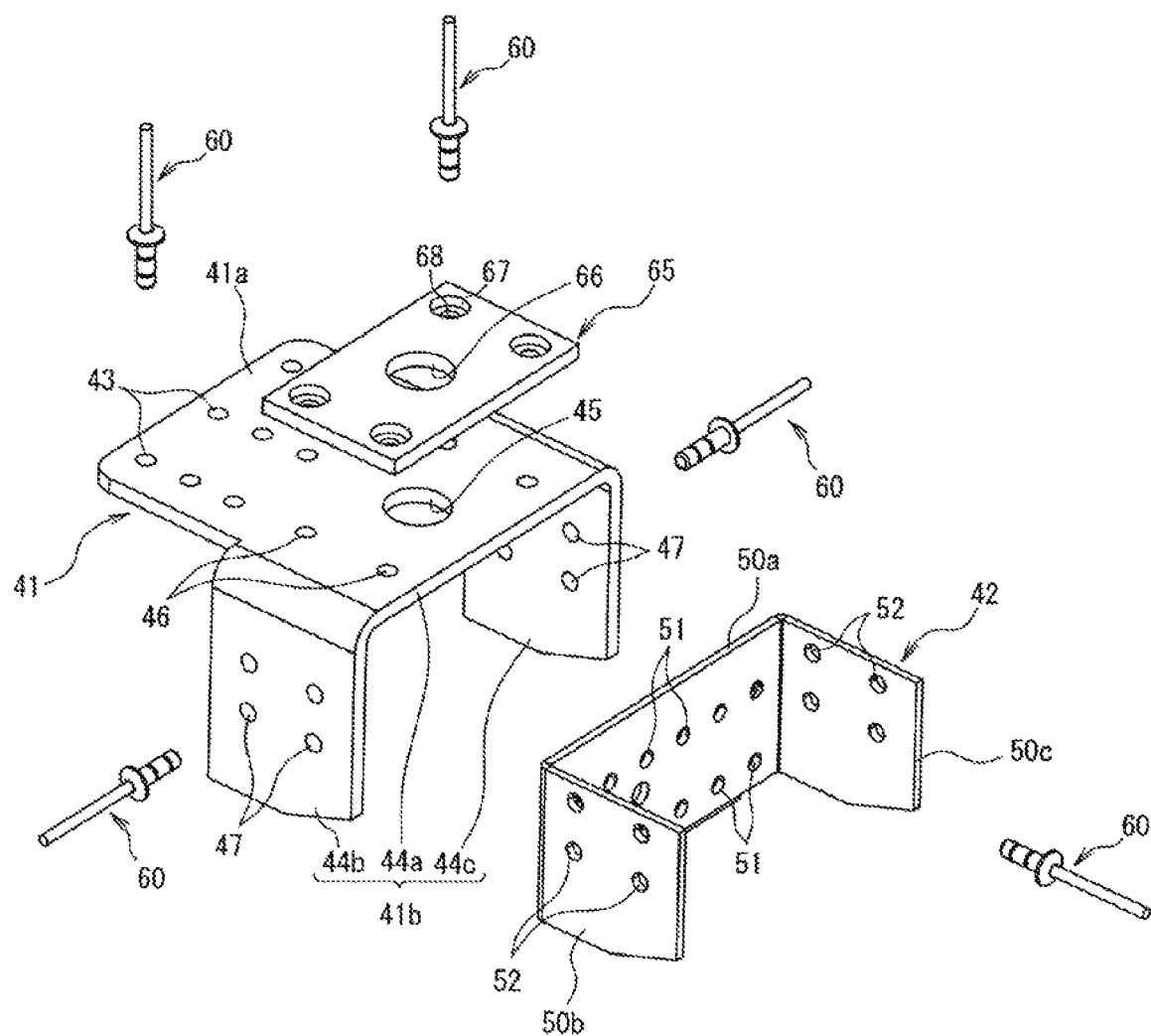
FIG. 10 is an exploded perspective view of the holding fixture.

As illustrated in FIGS. 9, 10, and 12, each holding fixture 40 includes a first member 41 which has an inverted U-shape when viewed in a side view and a second member 42 which has a U-shape when viewed in a plan view. The first member 41 is fixed to the top plate 22f (a first surface) of the first component-housing chassis 21A or the third component-housing chassis 21C. The second member 42 is fixed to the first member 41 and to the left side plate 22c or the right side plate 22d (a second surface) adjoining the top plate 22f of the first component-housing chassis 21A or the third component-housing chassis 21C.

As illustrated larger in FIG. 10, the first member 41 includes a first attaching portion 41a having a flat plate shape and a second attaching portion 41b having an inverted U-shape when viewed in a rear view, which are formed in an integrated manner. The first attaching portion 41a is fixed to the top plate 22f (first surface) of the first component-housing chassis 21A and the third component-housing chassis 21C. In the first attaching portion 41a, nine rivet holes 43 are formed, for example.

The second attaching portion 41b is formed protruding out from the end of the first attaching portion 41a on the left side plate 22c or right side plate 22b (second surface) side. This second attaching portion 41b includes a first intermediate plate portion 44a, a first bent plate portion 44b, and a second bent plate portion 44c, which form an inverted U-shape when viewed in a side view. The first intermediate plate portion 44a is formed having a flat plate shape which connects with the first attaching portion 41a. The first bent plate portion 44b and the second bent plate portion 44c are formed by bending a pair of sides of the first intermediate plate portion 44a opposite to one another in the width direction downwards at right angles so as to face one another.

In addition, a bolt hole 45 for inserting a bolt for attaching to the vehicle body 12 is formed in the center of the first intermediate plate portion 44a, and rivet holes 46 are formed at four locations, for example, around this bolt hole 45. Rivet holes 47 are formed facing one another at four locations, for example, in the first bent plate portion 44b and the second bent plate portion 44c.

As illustrated larger in FIG. 10, the second member 42 includes a second intermediate plate portion 50a having a flat plate shape with vertically-oriented surfaces, and a third bent plate portion 50b and a fourth bent plate portion 50c which are respectively bent backwards at right angles from the left and right ends of the second intermediate plate portion 50a so as to face one another.

Rivet holes 51 are formed at a total of 12 locations (six upper locations and six lower locations) in the second intermediate plate portion 50a. In the third bent plate portion 50b and the fourth bent plate portion 50c, rivet holes 52 are formed at positions facing the rivet holes 46 in the first bent plate portion 44b and second bent plate portion 44c of the first member.

Moreover, the first member 41 and the second member 42 are joined together as a single component to form the holding fixture 40. In other words, the second member 42 is inserted into the second attaching portion 41b of the first member 41. Here, the second intermediate plate portion 50a is oriented toward the first attaching portion 41a side, and the outer surfaces of the third bent plate portion 50b and the fourth bent plate portion 50c are respectively brought into contact with the inner surfaces of the first bent plate portion 44b and the second bent plate portion 44c. In this state, the rivet holes 47 are positioned so as to align with the rivet holes 52. Therefore, the first attaching portion 41a of the first member 41 and the second intermediate plate portion 50a of the second member 42 form an L-shape when viewed in a front view. Then, the blind rivets 60 are inserted from the outer sides of the first bent plate portion 44b and the second bent plate portion 44c of the second attaching portion 41b of the first member 41 and fastened in place.

Furthermore, the blind rivets 60 are similarly used to fasten a gap-adjusting plate 65 to the top surface of the first intermediate plate portion 44a of the second attaching portion 41b of the first member 41. As illustrated in FIG. 10, in the gap-adjusting plate 65, a bolt hole 66 and rivet holes 67 are formed respectively facing the bolt hole 45 and the rivet holes 46 formed in the first intermediate plate portion 44a of the second attaching portion 41b. Here, counterbores 68 are formed in the top surface sides of the rivet holes 67. Therefore, when the gap-adjusting plate 65 is fixed to the first intermediate plate portion 44a of the second attaching portion 41b using the blind rivets 60, the flanges 61b of the blind rivets 60 do not protrude up from the top surface of the gap-adjusting plate 65.

First members 41 and second members 42 are thus joined together in this manner to form the holding fixtures 40. As illustrated in FIG. 2, these holding fixtures 40 are riveted to the top plate 22f (first surface) and to the left side plate 22c (second surface) of the first component-housing chassis 21A using the blind rivets 60. Similarly, the holding fixtures 40 are riveted to the top plate 22f (first surface) and to the right side plate 22d (second surface) of the third component-housing chassis 21C using the blind rivets 60.

Figure 6A:
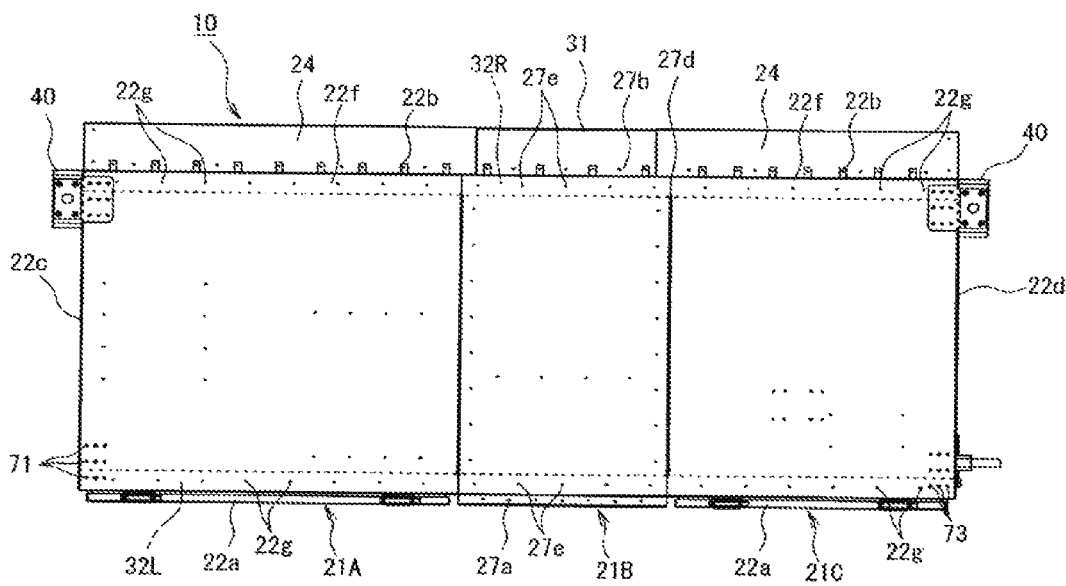
FIG. 6A is a plan view of the connected chassis in a state in which holding fixtures on the left side face have been removed.
Figure 6B:
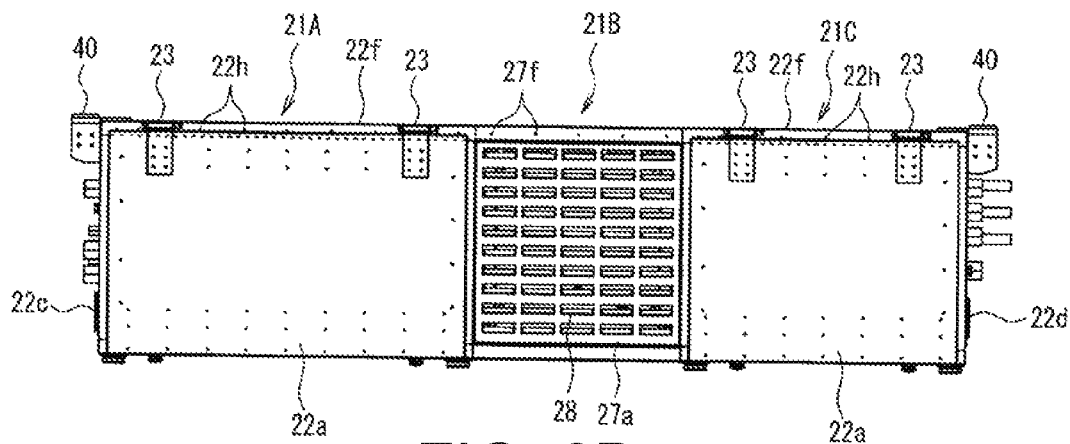
FIG. 6B is a front view of the connected chassis in the same state.
Figures 6C, 6D:
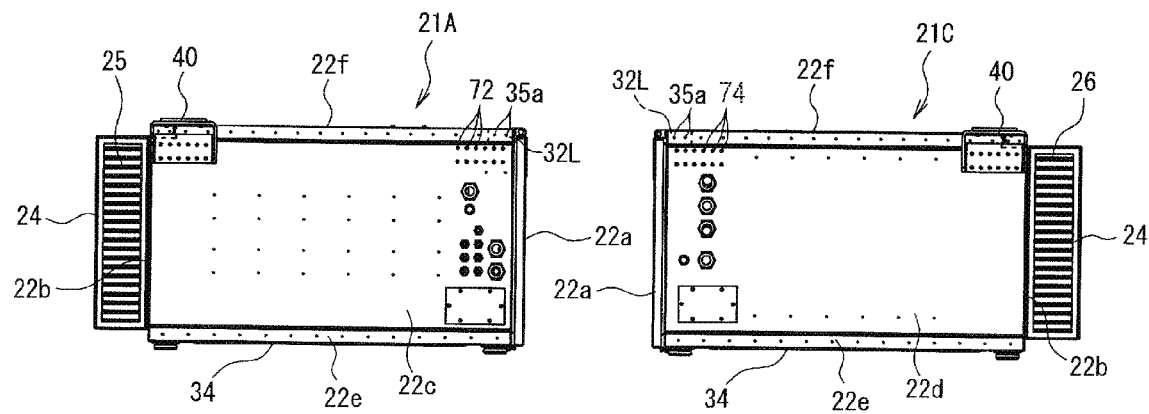
FIG. 6C is a left side view of the connected chassis in the same state.
FIG. 6D is a right side view of the connected chassis in the same state.
Figure 7:
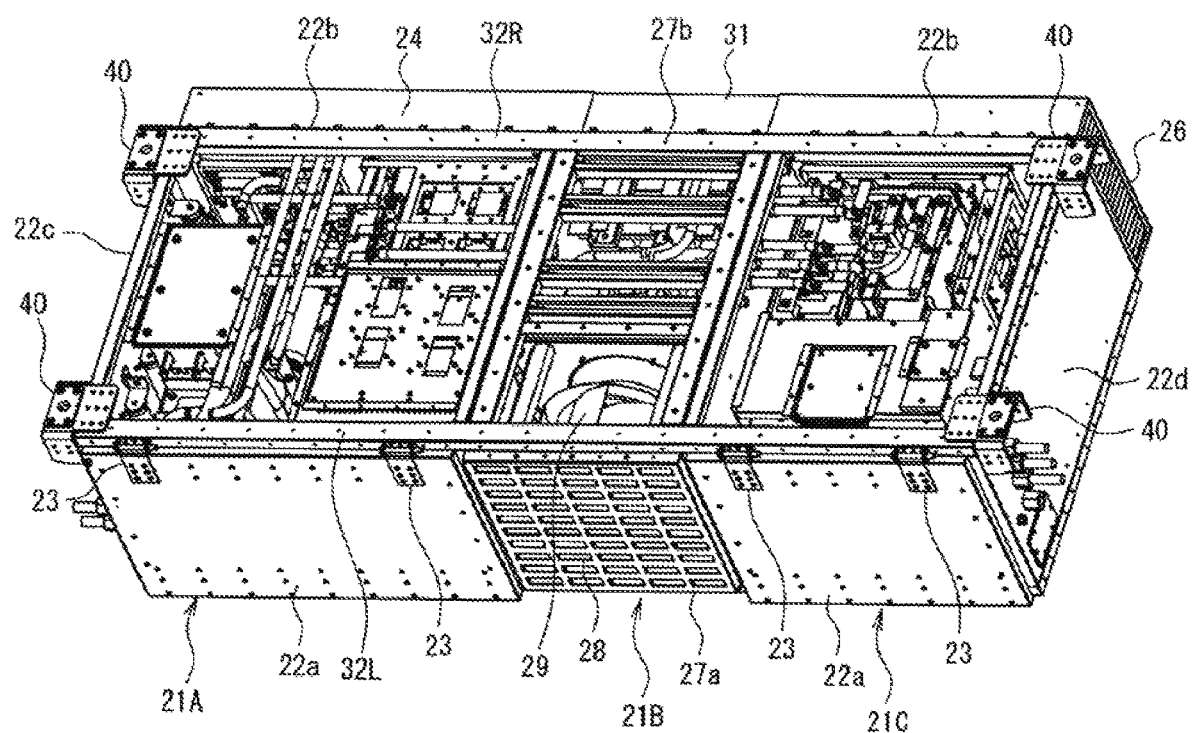
FIG. 7 is a perspective view of the connected chassis illustrated in FIG. 2 in a state in which top panels have been removed.
Figure 8A:
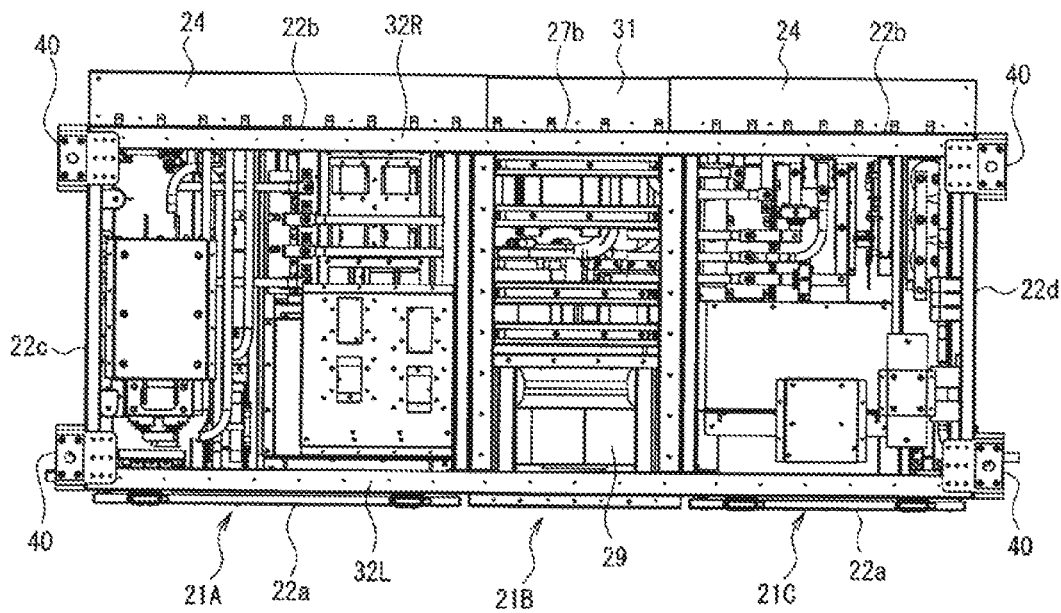
FIG. 8A is a plan view of the connected chassis illustrated in FIG. 7.
Figure 8B:
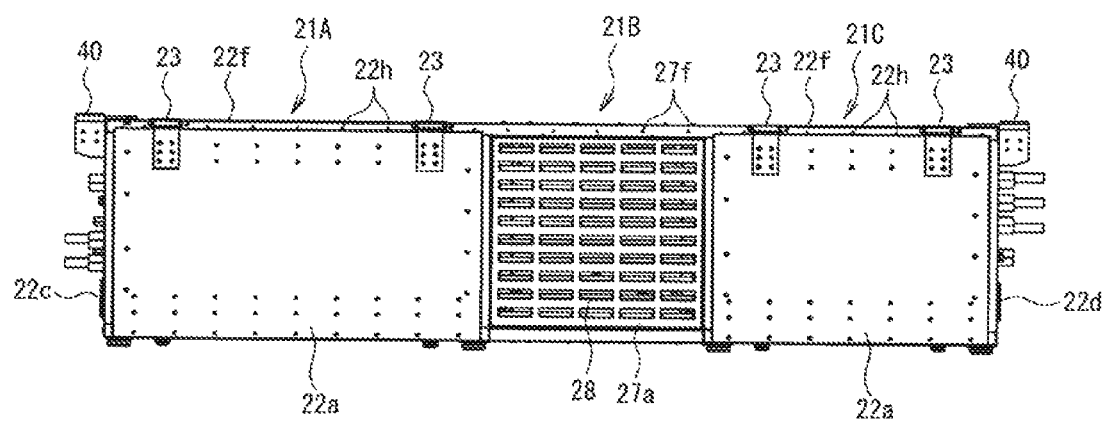
FIG. 8B is a front view of the connected chassis illustrated in FIG. 7.
Figure 8C:
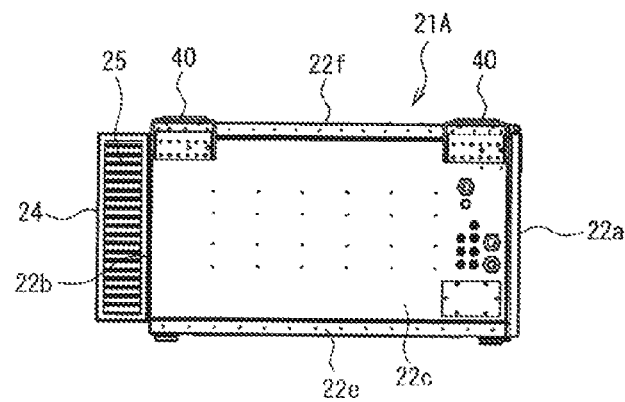
FIG. 8C is a left side view of the connected chassis illustrated in FIG. 7.

In order to do so, as illustrated in FIG. 6A, rivet holes 71 corresponding to the rivet holes 43 formed in the first attaching portion 41a of the first member 41 are formed in the top plate 22f (first surface) at holding fixture attachment positions of the first component-housing chassis 21A. Moreover, as illustrated in FIG. 6C, rivet holes 72 corresponding to the rivet holes 51 formed in the second intermediate plate portion 50a of the second member 42 are formed in the left side plate 22c (second surface). Furthermore, the rows of rivet holes 71 on the frontmost and rearmost sides of the top plate 22f are formed so as to align with the above-described rivet holes 32j formed in the support frames 32L and 32R.

Similarly, as illustrated in FIG. 6A, rivet holes 73 corresponding to the rivet holes 43 formed in the first attaching portion 41a of the first member 41 are formed in the top plate 22f (first surface) at holding fixture attachment positions on the third component-housing chassis 21C. Moreover, as illustrated in FIG. 6D, rivet holes 74 corresponding to the rivet holes 51 formed in the second intermediate plate portion 50a of the second member 42 are formed in the right side plate 22d (second surface). Furthermore, the rows of rivet holes 73 on the frontmost and rearmost sides of the top plate 22f are formed so as to align with the above-described rivet holes 32j formed in the support frames 32L and 32R.

Next, a method of assembling the power converter 10 will be described.

First, as illustrated in FIG. 3, the first component-housing chassis 21A housing the converter; the second component-housing chassis 21B housing components such as the intake fan 29, the transformer, and the reactor; and the third component-housing chassis 21C housing the inverter are prepared.

Here, as illustrated in FIG. 3, in order to make the second component-housing chassis 21B the base component-housing chassis, the support frames 32L and 32R are riveted to the top plate 27d, the front plate 27a, and the rear plate 27b in advance so as to protrude out from the right and left side faces.

Next, the left end sides of the support frames 32L and 32R are inserted into the frame insertion holes 33 in the first component-housing chassis 21A, and as illustrated in FIG. 12, the cover plate portions 32g on the ends are brought into contact with the back surface (inner surface) of the bent portion 35 of the top plate 22f.

In this state, the rivet holes 32h, 32i, and 32j formed in the support frames 32L and 32R are aligned with the rivet holes 22g in the top plate 22f and the rivet holes 22h in the front plate 22a and the rear plate 22b, respectively. Meanwhile, the rivet holes 32k formed in the cover plate portions 32g on the ends of the support frames 32L and 32R are aligned with rivet holes 35a formed in the bent portion 35 of the top plate 22f.

The head portions 62b of the mandrels 62 of the blind rivets 60 are inserted from the outer side into the aligned rivet holes 22g, 22h, and 35a of the first component-housing chassis 21A and rivet holes 32h, 32i, and 32j (of the support frame 32L and 32R).

Then, after bringing the flanges 61b of the rivet bodies 61 into contact with the top plate 22f, the front plate 22a, the rear plate 22b, and the bent portion 35 of the top plate 22f, the shafts 62a of the mandrels 62 are pulled using a fastening tool (not illustrated in the figures).

As a result, inside the support frames 32L and 32R, the head portion 62b of each mandrel 62 causes buckling deformation in the cylinder portion 61a on the side opposite to the flange 61b of the rivet body 61, thereby forming an expanded portion which protrudes outwards. When formation of this expanded portion is complete, the mandrel 62 is broken off at the small-diameter breaking portion 62c formed in the shaft 62a.

As a result, the support frames 32L and 32R, and the top plate 22f, the front plate 22a, the rear plate 22b, and the bent portion 35 of the top plate 22f are fastened together by the rivet bodies 61.

Meanwhile, the connection flange 34 of the second component-housing chassis 21B and the bottom plate 22e of the first component-housing chassis 21A are also riveted together using the blind rivets 60 in the same manner as described above.

Next, the support frames 32L and 32R protruding from the right side of the second component-housing chassis 21B are inserted into the frame insertion holes in the third component-housing chassis 21C, and the support frames 32L and 32R and the third component-housing chassis 21C are riveted together using the blind rivets 60 in a manner similar to with the first component-housing chassis 21A. Meanwhile, the connection flange 34 of the second component-housing chassis 21B and the bottom plate 22e of the third component-housing chassis 21C are also riveted together using the blind rivets 60 in the same manner as described above.

In this way, the first component-housing chassis 21A, the second component-housing chassis 21B, and the third component-housing chassis 21C are connected together to form the connected chassis 21.

Next, the holding fixtures 40 are fixed to the top plate 22f and the left side plate 22c at the front and rear corners on the left side of the first component-housing chassis 21A.

To attach these holding fixtures 40, first, for the first component-housing chassis 21A, the rivet holes 43 formed in the first attaching portion 41a of the first member 41 of each holding fixture 40 are aligned with the rivet holes 71 formed near the left edge of the top plate 22f. Meanwhile, the rivet holes 51 formed in the second intermediate plate portion 50a of the second member 42 of each holding fixture 40 are aligned with the rivet holes 72 formed in the left side plate 22c. Here, the frontmost row of rivet holes 71 formed at the front corner align with the rivet holes 32j in the support frame 32L and the rearmost row of rivet holes 71 formed at the rear corner align with the rivet holes 32j in the support frame 32R.

In this state, the head portions 62b of the mandrels 62 of the blind rivets 60 are inserted into the rivet holes 71 and 43 from the outer side of the top plate 22f, and the flanges 61b are brought into contact with the surface of the first attaching portion 41a of the first member 41 of each holding fixture

40. Here, as illustrated in FIG. 12, the head portions 62*b* of the mandrels 62 of the blind rivets 60 and the ends of the cylinder portions 61*a* of the rivet bodies 61 protrude out from the inner surface of the top plate 22*f*. FIG. 12 also illustrates how the rivet holes 71 align with the rivet holes 32*j* in the support frame 32L, with the head portions 62*b* of the mandrels 62 and the ends of the cylinder portions 61*a* of the rivet bodies 61 protruding out from the center plate portion 32*a* of the support frame 32L.

In this state, the shafts 62*a* of the mandrels 62 are pulled out using a fastening tool (not illustrated in the figures) to make the cylinder portions 61*a* of the rivet bodies 61 expand and form the expanded portions, thus causing the first member 41 of the holding fixture 40, the top plate 22*f*, and the support frame 32L to be fastened together by the rivet bodies 61.

Similarly, the second member 42 of the holding fixture 40 is riveted to the left side plate 22*c* of the first component-housing chassis 21A using the blind rivets 60.

Moreover, the other holding fixture 40 is fixed to the rear end side of the first component-housing chassis 21A in a similar manner using the blind rivets 60. In this case, the rearmost row of rivet holes 43 in the first member 41 of the holding fixture 40 is aligned with the rivet holes 32*j* in the support frame 32R, and then the holding fixture 40 and the support frame 32R are riveted together with the top plate 22*f* interposed therebetween.

Next, for the third component-housing chassis 21C, holding fixtures 40 are riveted to the top plate 22*f* and the right side plate 22*d* using the blind rivets 60 in the same manner as described above. Here, for the third component-housing chassis 21C, the outermost row of rivet holes 43 in the first member 41 of each holding fixture 40 is aligned with the rivet holes 73 in the top plate 22*f* and the rivet holes 32*j* in the support frame 32L or 32R. The holding fixtures 40 are then riveted to the support frame 32L or 32R with the top plate 22*f* interposed therebetween.

Then, the connected chassis 21 to which the holding fixtures 40 have been attached is bolted into place in a state in which the top surfaces of the gap-adjusting plates 65 contact L-shaped brackets, for example (not illustrated in the figure), formed on the underfloor of the vehicle body 12 of the railway vehicle 11, thereby making it possible to fix the connected chassis 21 to the underfloor of the vehicle body 12 in a suspended manner.

Thus, in the embodiment as described above, the support frames 32L and 32R are fixed to the second component-housing chassis 21B (the base component-housing chassis) with both ends protruding out from the left side face and right side face. Then, the support frames 32L and 32R are inserted into the frame insertion holes 33 in the first component-housing chassis 21A and the third component-housing chassis 21C, thereby making it possible to easily position the first component-housing chassis 21A and the third component-housing chassis 21C with the second component-housing chassis 21B in the center.

Next, the first component-housing chassis 21A and the third component-housing chassis 21C are riveted to the support frames 32L and 32R, thereby making it possible to connect together the first component-housing chassis 21A, the second component-housing chassis 21B, and the third component-housing chassis 21C to form the connected chassis 21. Here, using the blind rivets 60 as the rivets makes it possible to easily assemble each enclosure from the outer side.

Moreover, once the connected chassis 21 is assembled, the first component-housing chassis 21A, the second component-housing chassis 21B, and the third component-housing chassis 21C are connected together via the elongated support frames 32L and 32R. Therefore, when bending loads from the weight of the connected chassis 21 itself are applied to the center portion about the right and left ends thereof, for example, it is possible to maintain sufficient mechanical strength.

This makes it possible to provide a power converter which makes it possible to simplify the assembly work while also reducing weight.

Here, using support frames 32L and 32R with an inverted U-shaped cross-section makes it possible to achieve sufficient bending strength, and forming the lip portions 32*d* and 32*e* extending inwards at an open edge to form a lipped channel (C-channel) shape makes it possible to further improve mechanical strength.

Furthermore, riveting the holding fixtures 40 (hanging lugs) to the support frames 32L and 32R makes it possible to, simply by fixing the holding fixtures 40 to the four corners on either end of the top surface of the elongated connected chassis 21, for example, maintain sufficient mechanical strength even when oscillatory loads resulting from oscillation in the lengthwise direction of the vehicle or oscillation in the widthwise direction of the vehicle due to acceleration and deceleration of the vehicle body 11 are transmitted to the holding fixtures 40.

Note that although the embodiment above was described as having, as support frames, the two support frames 32L and 32R arranged at the front and rear positions of the top surface of the connected chassis 21, the present invention is not limited to this configuration. Support frames can be arranged at the front, rear, and center positions of the top surface for a total of three support frames, or a support frame can be arranged along each of the four corners for a total of four support frames. The number of support frames can be set to any number greater than or equal to two.

Moreover, the shape of the support frames 32L and 32R is not limited to being a U-shape or a lipped channel shape and can be any shape, such as an L-shape, a square tube shape, or a triangular tube shape. Furthermore, the protrusion lengths of the support frames 32L and 32R are not limited to being set to the lengths reaching the ends of the first component-housing chassis 21A and third component-housing chassis 21C and can be set to the lengths reaching intermediate positions within the first component-housing chassis 21A and third component-housing chassis 21C. These protrusion lengths can be set to any value.

In addition, although in the embodiment above the holding fixture 40 was described as including the first member 41 and the second member 42, which are both U-shaped, the present invention is not limited to this configuration. For example, a flat plate-shaped first member and an L-shaped second member may be combined to form a T-shape when viewed in a side view. In other words, the holding fixture 40 can have any configuration as long as that configuration allows the holding fixture 40 to be attached to a first surface and an adjoining second surface of the first component-housing chassis 21A and the third component-housing chassis 21C.

Moreover, in the embodiment above, the second component-housing chassis 21B was described as being the base component-housing chassis, with the support frames 32L and 32R being fixed to this second component-housing chassis 21B so as to protrude out on both the right and left sides. However, the present invention is not limited to this configuration, and the first component-housing chassis 21A (or the third component-housing chassis 21C) may be designated as being the base component-housing chassis, in which case the support frames may be fixed thereto so as to protrude out from the right end (or left end), pass through the second component-housing chassis 21B, and extend into the third component-housing chassis 21C (or the first component-housing chassis 21A).

Furthermore, although in the embodiment above the connected chassis 21 was described as being configured by connecting together the three component-housing chassis 21A to 21C, the present invention is not limited to this example and can also be applied to a connected chassis configured by connecting together two or four or more component-housing chassis.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A power converter to be mounted to a mounting portion of a host in a suspended manner, comprising:
    a plurality of separate and distinct component-housing chassis configured to be connected together parallel to the mounting portion, the plurality of component-housing chassis each enclosing and containing parts for a power converter so that the plurality of component-housing chassis, when connected together, collectively constitute the power converter for the host,
    wherein at least one of the plurality of component-housing chassis has a support frame, the support frame protruding out so as to extend into at least an adjacent one of the component-housing chassis,
    wherein said at least adjacent one of the component-housing chassis has an insertion hole for inserting the support frame, and
    wherein the support frame is configured to be inserted into the insertion hole in the adjacent component-housing chassis and fixed to the adjacent component-housing chassis, and
    wherein the support frame includes a bar having a lipped channel-shaped cross-sectional shape, and
    wherein the insertion hole includes a fitted protrusion which fits into a channel portion of the bar.

2. The power converter according to claim 1, wherein the support frame extends to an inner end face of the adjacent component-housing chassis on a side opposite to said at least one of the plurality of component-housing chassis, with a cover plate portion being formed on an end face of the support frame.

3. The power converter according to claim 2, wherein a fixing portion that fixes the support frame to the adjacent component-housing chassis is formed in the cover plate portion.

4. The power converter according to claim 3, wherein the fixing portion is a through hole for inserting a blind rivet.

5. The power converter according to claim 3, wherein a holding fixture is attached to both a first surface facing the mounting portion and a second surface adjoining the first surface of at least one of the plurality of component-housing chassis.

6. The power converter according to claim 1, wherein the support frame and the adjacent component-housing chassis are configured to be fastened with each other using blind rivets.

* * * * *